United States Patent
Pellizzer et al.

(10) Patent No.: US 8,410,527 B2
(45) Date of Patent: Apr. 2, 2013

(54) ELECTRICAL FUSE DEVICE BASED ON A PHASE-CHANGE MEMORY ELEMENT AND CORRESPONDING PROGRAMMING METHOD

(75) Inventors: Fabio Pellizzer, Cornate D'adda (IT); Innocenzo Tortorelli, Moncalieri (IT); Agostino Pirovano, Corbetta (IT); Roberto Bez, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/212,080

(22) Filed: Aug. 17, 2011

(65) Prior Publication Data

US 2011/0298087 A1 Dec. 8, 2011

Related U.S. Application Data

(62) Division of application No. 11/625,178, filed on Jan. 19, 2007, now abandoned.

(30) Foreign Application Priority Data

Jan. 20, 2006 (EP) ..................................... 06425025

(51) Int. Cl.
*H01L 29/74* (2006.01)
(52) U.S. Cl. ........................................ 257/209; 257/529
(58) Field of Classification Search ................. 257/209, 257/529, 50
See application file for complete search history.

(56) References Cited

U.S. PATENT DOCUMENTS

| | | | |
|---|---|---|---|
| 6,337,507 B1 | 1/2002 | Bohr et al. | |
| 6,448,576 B1 * | 9/2002 | Davis et al. | 257/50 |
| 6,545,903 B1 * | 4/2003 | Wu | 365/148 |
| 6,579,760 B1 | 6/2003 | Lung | |
| 6,816,404 B2 * | 11/2004 | Khouri et al. | 365/163 |
| 6,891,747 B2 * | 5/2005 | Bez et al. | 365/158 |
| 2003/0209746 A1 | 11/2003 | Horii | |
| 2003/0218492 A1 | 11/2003 | Denham et al. | |
| 2004/0057271 A1 * | 3/2004 | Parkinson | 365/99 |
| 2004/0113136 A1 * | 6/2004 | Dennison | 257/2 |
| 2005/0185444 A1 | 8/2005 | Yang et al. | |
| 2007/0051936 A1 | 3/2007 | Pellizzer et al. | |

FOREIGN PATENT DOCUMENTS

| | | |
|---|---|---|
| WO | 03/021675 A3 | 3/2003 |
| WO | 2004/030033 A2 | 4/2004 |
| WO | 2006/031503 A1 | 3/2006 |

OTHER PUBLICATIONS

Pirovano, A. et al., "Scaling Analysis of Phase-Change Memory Technology," IEDM Tech. Dig., pp. 699-702, 2003.

* cited by examiner

*Primary Examiner* — Steven Loke
*Assistant Examiner* — Kimberly M Thomas
(74) *Attorney, Agent, or Firm* — Seed IP Law Group PLLC (57) ABSTRACT

A fuse device has a fuse element provided with a first terminal and a second terminal and an electrically breakable region, which is arranged between the first terminal and the second terminal and is configured to undergo breaking as a result of the supply of a programming electrical quantity, thus electrically separating the first terminal from the second terminal. The electrically breakable region is of a phase-change material, in particular a chalcogenic material, for example GST.

19 Claims, 6 Drawing Sheets

ELECTRICAL FUSE DEVICE BASED ON A PHASE-CHANGE MEMORY ELEMENT AND CORRESPONDING PROGRAMMING METHOD

BACKGROUND OF THE INVENTION

1. Field of the Invention

The present invention relates to an electrical fuse device based on a phase-change memory element and to a corresponding programming method, in particular for a read-only memory (ROM) of the one-time-programmable (OTP) type, to which the following description will make reference, without this implying any loss in generality.

2. Description of the Related Art

As is known, in the manufacturing process of integrated circuits, one-time-programmable ROMs find a wide range of applications for permanent storage of information, or for forming permanent connections within integrated circuits. For example, these memories can be used for programming redundant elements in order to replace identical elements that have proven faulty during an electrical testing (operation known as EWS—Electrical Wafer Sorting), prior to carrying out packaging or soldering of the integrated circuits on the board, or else for storage of basic information regarding the integrated circuit, such as identifier codes or calibration information. In particular, the aforesaid information must be stored in a permanent way in order to be recovered after the packaging or soldering operations.

In order to produce the aforesaid memories using semiconductor technology, the use of $E^2PROM$ (Electrically Erasable Programmable Read-Only Memory) devices, fuse devices and anti-fuse devices has been proposed. However, for reasons that will be briefly set forth, the solutions referred to have some problems that do not make their use totally satisfactory within modern integrated devices.

In particular, $E^2PROM$ devices require oxide layers having a large thickness (for example, 7 nm) to prevent high leakage currents and sustain a charge stored on a corresponding floating terminal. The scales of integration required by modern integrated circuits do not always enable use of such large oxide thicknesses. Furthermore, the use of $E^2PROM$ devices in any case involves a high area occupation.

The fuse devices commonly used for the applications referred to above are programmed using a laser, which is used to cut a connection after the fuse device has been manufactured. Laser programming entails an additional process step, extraneous to semiconductor technology, and moreover calls for a perfect alignment of the laser with respect to the fuse device to be programmed.

Anti-fuse devices are typically based on the perforation of metal-insulator-metal structures to obtain low-resistance paths. Said devices require high programming voltages, and consequently involve high breaking voltages of the programming circuits associated thereto. Furthermore, said devices are generally of a horizontal type and involve a high area occupation.

Other types of semiconductor fuse devices that can be electrically altered, for example based on polysilicon resistors, have been proposed, for example in the U.S. Pat. No. 6,337,507 and in the patent application No. US 2003/0218492. However, none of said devices is optimized in terms of costs, manufacturing times, and programming times (which should be as short as possible).

Phase-change memories (PCMs) are moreover known, which exploit, for storage of information, the characteristics of materials that have the property of switching between phases having different electrical characteristics. For example, said materials can switch between a disorderly, amorphous phase and an orderly, crystalline or polycrystalline phase, and the two phases are associated to resistivities having considerably different values, and consequently to different values of a stored datum. Currently, the elements of Group VI of the periodic table, such as tellurium (Te), selenium (Se), or antimony (Sb), referred to as chalcogenides or chalcogenic materials, may advantageously be used to obtain phase-change memory cells. The currently most promising chalcogenide is formed by an alloy of Ge, Sb and Te, generically referred to as GST (for example, $Ge_2Sb_2Te_5$).

The phase changes are obtained by locally increasing the temperature of the cells of chalcogenic material by means of resistive electrodes (generally known as heaters) set in contact with the region of chalcogenic material. A selection device (for example, a MOSFET or a bipolar transistor), is connected to the heater and is configured to enable passage of a programming electrical current through the heater. Said electrical current, by the Joule effect, generates the temperatures necessary for phase change. In particular, since the minimization of the area of contact between the heater and the region of chalcogenic material is a primary requisite in such devices, in order to ensure repeatability of the programming operations, the heaters generally have sublithographic sections (i.e., dimensions smaller than the dimensions that can be achieved with current lithographic techniques, for example smaller than 100 nm, down to approximately 5-20 nm).

A wide range of manufacturing processes have been proposed to obtain phase-change memory cells, and the configurations of the resulting memory cells are different, in particular as regards coupling between the heater and a corresponding chalcogenic region. For example, a microtrench architecture is described in U.S. Pat. No. 6,891,747, while a lance-shaped or ring-shaped tubular architecture is described in U.S. patent application Ser. No. 11/398,858, filed on Apr. 6, 2006.

Although advantageous as regards performance and manufacturing costs, PCMs cannot be used in the applications described above. In fact, the high temperatures that are generated during the processes of packaging or soldering on the board can lead to the change of state of previously programmed memory cells and the consequent loss of the stored information. In particular, the possibility exists that memory cells in the amorphous state will switch to the crystalline state on account of said high temperatures.

BRIEF SUMMARY OF THE INVENTION

One embodiment of the present invention is a fuse device (in particular for one-time-programmable memory elements) that enables the aforesaid disadvantages and problems to be overcome.

According to one embodiment of the present invention, a fuse device includes a fuse element having a first terminal and a second terminal, and an electrically breakable region arranged between said first and second terminals and configured to undergo breaking as a result of the supply of a programming electrical quantity, wherein said electrically breakable region comprises phase-change material.

BRIEF DESCRIPTION OF THE SEVERAL VIEWS OF THE DRAWINGS

For a better understanding of the present invention, preferred embodiments thereof are now described, purely by way of non-limiting example and with reference to the attached plate of drawings, wherein.

DETAILED DESCRIPTION OF THE INVENTION

One embodiment of the present invention envisages use of a phase-change memory element to provide a semiconductor fuse device. The phase-change memory element is programmed for this purpose in two stable states: a low-resistivity closed state (for example corresponding to a "1"), and an open state (for example corresponding to a "0"). In particular, the open state is obtained by physical breaking of a region of chalcogenic material of the phase-change memory element, via application of a given electrical quantity (in particular, via the passage of a high electrical current). In this manner, the information associated to both states are stable and not modifiable, for example by soldering or packaging of a corresponding integrated circuit.

Figure 1:
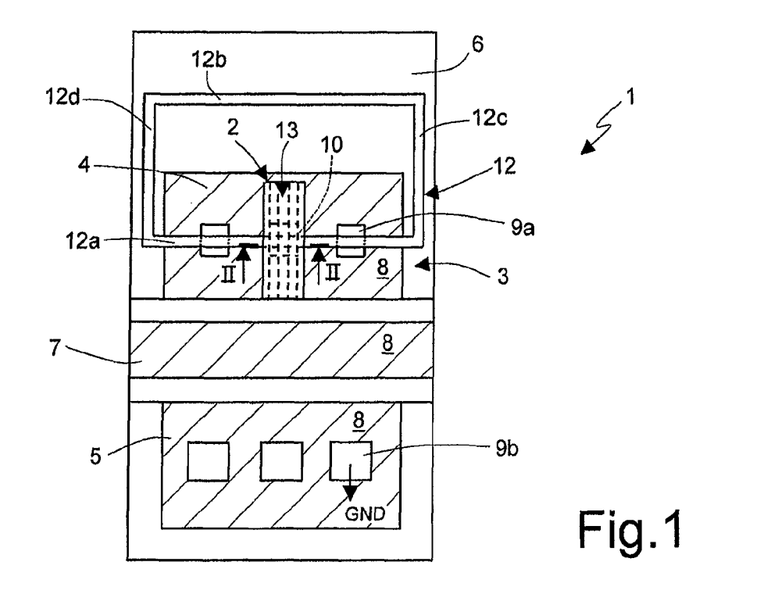
FIG. 1 is a schematic top plan view of a semiconductor fuse device according to a first embodiment of the present invention, with parts removed for greater clarity.
Figure 2:
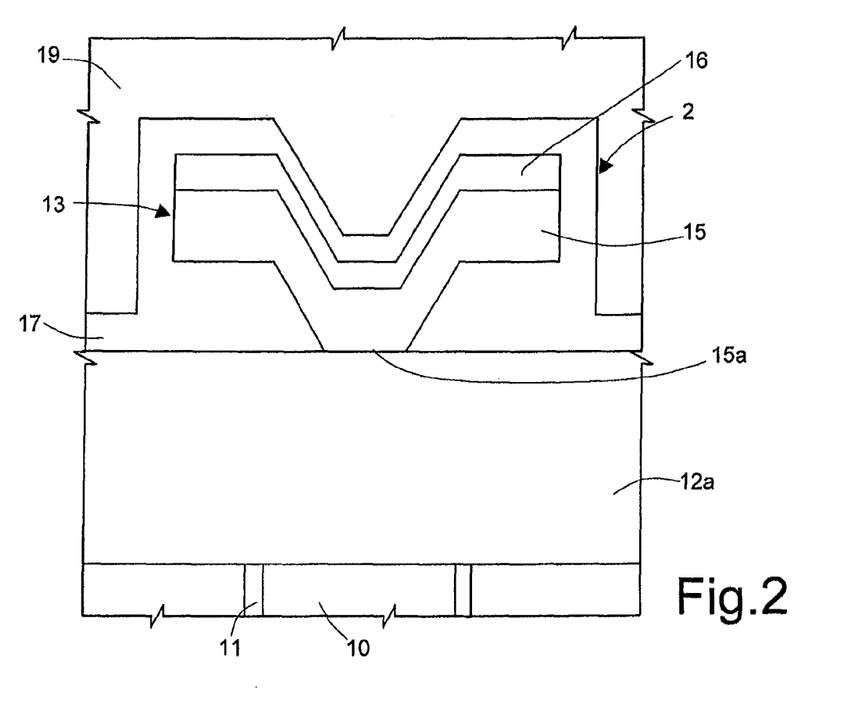
FIG. 2 is a cross-sectional view of a portion of the fuse device of FIG. 1 taken along the line II-II, in which a phase-change fuse element is illustrated, in a first operating condition.

In detail, and as illustrated in FIGS. 1 and 2, a fuse device 1 according to a first embodiment of the present invention, comprises a fuse element 2 (as will be clarified hereinafter, based on a phase-change memory element), and a selector element 3, which is electrically connected to the fuse element 2 and is configured to enable programming of the fuse element 2. In particular, by way of example, the selector element 3 illustrated in FIG. 1 is an N-channel MOSFET of a planar type. It is clear, however, that other selector elements could be used in an altogether equivalent way, for example any FET (vertical MOSFET, JFET, FinFET, etc.), or else a BJT or a BiFET. Furthermore, FIG. 1 and the following figures illustrate a phase-change memory element having a microtrench architecture. Once again, it is clear that other structures could be used in an altogether equivalent way, for example of the wall or tubular type.

In detail, the selector element 3 is provided with: a first current-conduction region (in particular, a current-input region), in the example a drain region 4, and a second current-conduction region (in particular, a current-output region), in the example a source region 5, which are formed, in a known way, within a substrate 6 of semiconductor material (in particular silicon); and a control region, in the example, a gate region 7, set above the substrate 6 between the drain region 4 and source region 5, and partially overlapping them. The aforesaid regions are coated with a respective silicidation region 8, and contact elements 9a, 9b, in particular plugs, made, for example, of tungsten surrounded by a Ti/TiN multilayer, extend vertically with respect to the substrate 6, from the drain region 4 and the source region 5, respectively.

As illustrated in detail in FIG. 2, the fuse element 2 has a vertical structure and comprises a bottom electrode 10, made, for example, of tungsten (W), surrounded by first barrier regions 11, for example constituted by a Ti/TiN multilayer. In particular, the bottom electrode 10 is made by an end portion of a contact element 9a associated to the drain region 4 of the selector element 3, preferably a contact element arranged in a central position with respect to the drain region 4 so that the fuse element 2 is set above the drain region.

A heater 12 is placed on, and in contact with, the bottom electrode 10. The heater 12, as may be seen in FIG. 1, extends along the periphery of an approximately rectangular area, and has a first long portion 12a and a second long portion 12b, and a first short portion 12c and a second short portion 12d, said long portions and short portions being orthogonal to one another. Each of said portions 12a-12d (as illustrated for example in the next FIG. 10) has a channel-shaped structure, and is made by a metallic coating, for example of TiSiN, which forms respective side walls and a respective bottom surface, and by a dielectric filling material. Contact between the bottom electrode 10 and the bottom wall of the heater 12 occurs at a central area of the first long portion 12a of the heater 12. The second long portion 12b is instead set outside the drain region 5.

A phase-change memory element 13 (referred to in what follows as PCM element 13) is set above the heater 12, in particular above the first long portion 12a thereof, in a position vertically corresponding to the bottom electrode 10. In detail, the PCM element 13 comprises a chalcogenic region 15, made of phase-change material, for example GST ($Ge_2Sb_2Te_5$), and a second barrier region, made, for example, of Ti/TiN, on the chalcogenic region 15. In particular, the second barrier region constitutes a top electrode 16 of the fuse element 2. The PCM element 13 extends longitudinally on an approximately rectangular area (approximately parallel to the first and second short portions 12c, 12d of the heating element 12) crossing the long portion 12a of the heating element 12. Moreover, the PCM element 13 is formed (in a known way) with the microtrench technique, and the chalcogenic region 15 contacts the walls of the central area of the first long portion 12a of the heater 12 only at a central depression having a cross section with sublithographic dimensions. The area of contact is a storage area 15a (and, as will be clarified hereinafter, an electrically breakable area) of the fuse device 1. A closing region 17, made, for example, of silicon nitride, surrounds the PCM element 13 and covers the heater 12 at the top. In addition, an insulation region 19 surrounds and electrically insulates the fuse element 2.

In use, via purposely provided electrical contacts (not illustrated), the top electrode 16 is connected to a high-voltage line $V_{cc}$, for example to the supply line of the fuse device 1, and the source region 5, via the corresponding contact elements 9b, is connected to a reference-voltage line GND of the fuse device 1. When enabled by a control signal supplied to the gate region 7, a programming current consequently passes through the fuse element 2 from the top electrode 16 to the bottom electrode 10, traversing the chalcogenic region 15 and the storage area 15a, and then flows through the selector element 3 from the drain region 4 to the source region 5.

Figure 3:
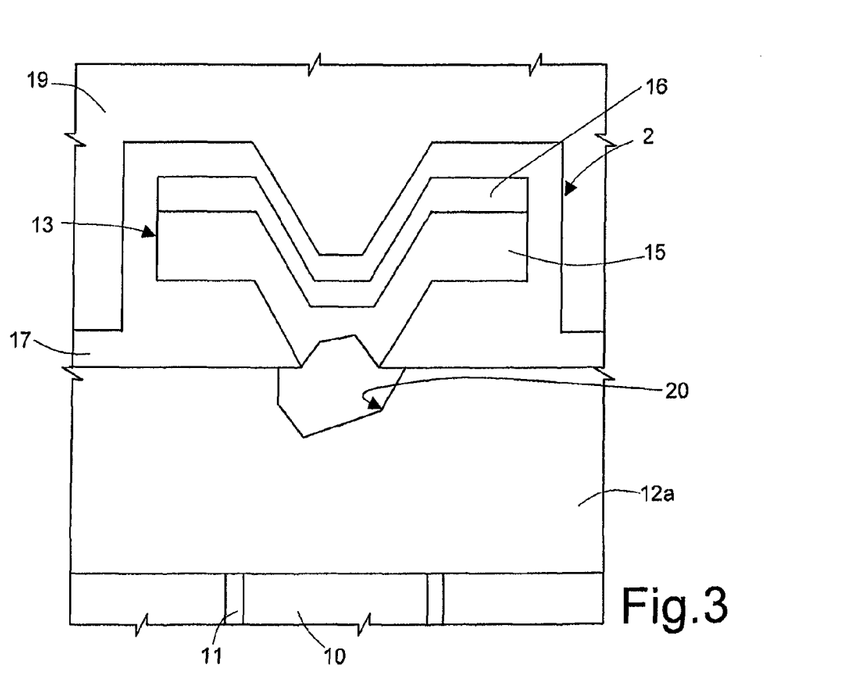
FIG. 3 is a view similar to that of FIG. 2 regarding a second operating condition of the phase-change fuse element.
Figure 4:
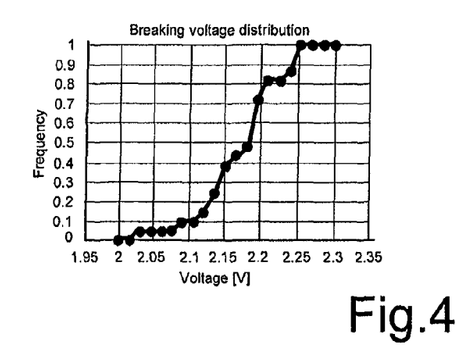
FIGS. 4-6 show graphs regarding electrical quantities associated to the fuse element of FIGS. 2 and 3.
Figure 5:
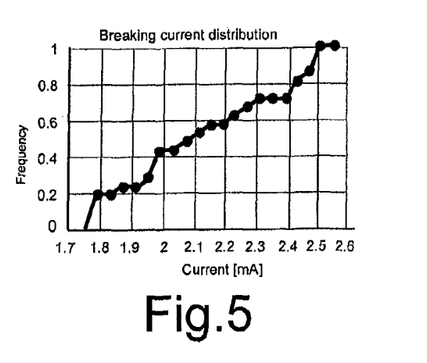

According to one embodiment of the present invention, the open state of the fuse element 2 is programmed by applying a current and a voltage having a value such as to cause physical breaking of the storage area 15a. For this purpose, a programming pulse is applied having a duration, for example, of between 100 ns and 1 μs, with a current of, for example, 2.5 mA, and a voltage of, for example, 2.5 V. As illustrated in FIG. 3, said programming pulse causes breaking of the storage area 15a, and creation of a void 20, which interrupts the electrical connection between the top electrode 16 and the bottom electrode 10 of the fuse element 2 (creating the open state, or high-resistance state). In detail, the void 20 extends in part in the chalcogenic region 15 and in part in the heater 12. As illustrated in FIGS. 4 and 5, relating to experimental tests conducted by the applicant with a fuse device 1 built with a 180-nm technology and with programming pulses of 300 ns, breaking of the storage area 15a is obtained using voltages having a value of between approximately 2 V and 3 V (preferably 2.5 V), and currents having a value of between approximately 2 mA and 3 mA (preferably 2.5 mA).

Figure 6:
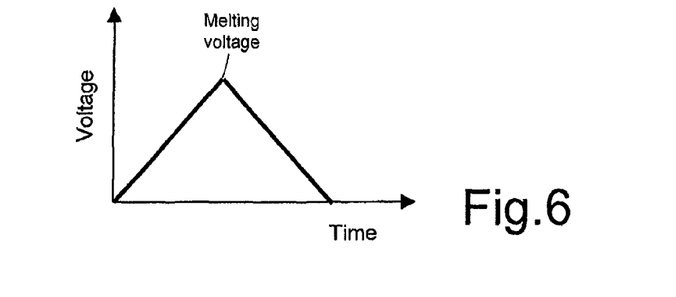

The closed state of the fuse element 2 is instead programmed by applying to the storage area 15a a triangular voltage pulse (FIG. 6), for example having a duration of 1 μs and an amplitude of 700 μA. Said pulse causes melting of the chalcogenic material (at a temperature of approximately 600° C.) and subsequent slow cooling thereof, which leads to its crystallization. Alternatively, a single crystallization pulse can be applied, or else a sequence of pulses having decreasing amplitudes. Typically, the crystallization procedure has a duration of between 1 and 10 μs.

Given the high values of current used in the breaking operations of the fuse device 1, one embodiment of the present invention envisages exploitation of the so-called "ballast" effect to prevent the known effects of "crowding" of the current and of thermal "run-away" of the selector element 3. In a per se known manner, the ballast effect leads to a greater uniformity of the current distribution, and occurs as the resistance increases along the path of the current.

Figure 7:
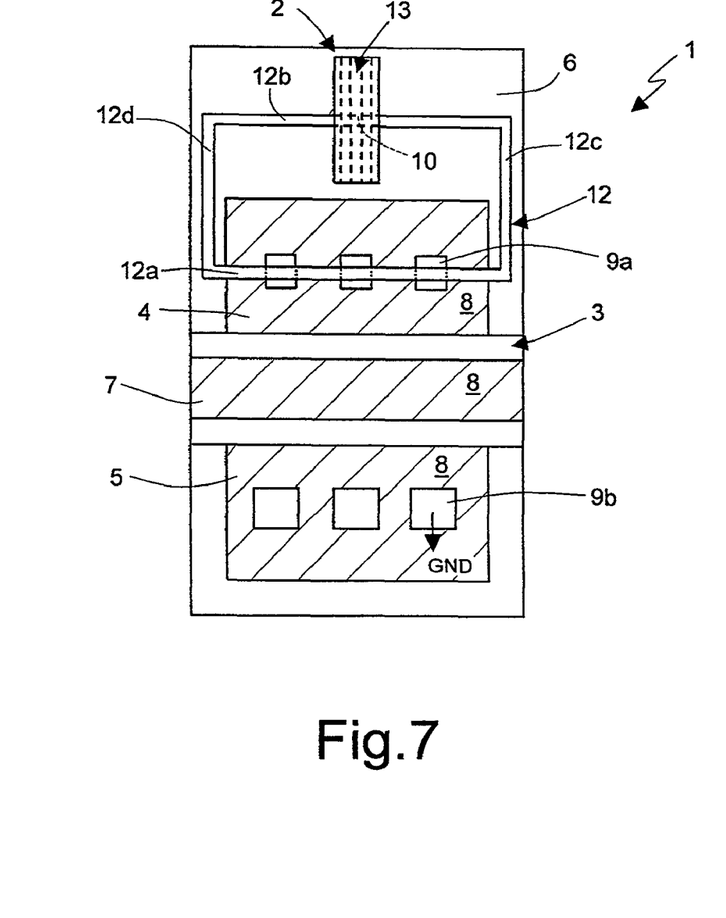
FIG. 7 is a view similar to that of FIG. 1, illustrating a variant of the fuse device.

For the above purpose (see FIG. 7), according to a first variant, the PCM element 13 is arranged above the second long portion 12b of the heater 12 at a distance from the contact elements 9a associated to the drain region 4. The electrical contact with the PCM element 13, and in particular with the storage area 15a, is in any case guaranteed by the presence of metallic material on the side walls and on the bottom surface of the heater 12, and by its continuity. However, advantageously, the heating element represents a series resistance to the passage of the programming current.

Figure 8:
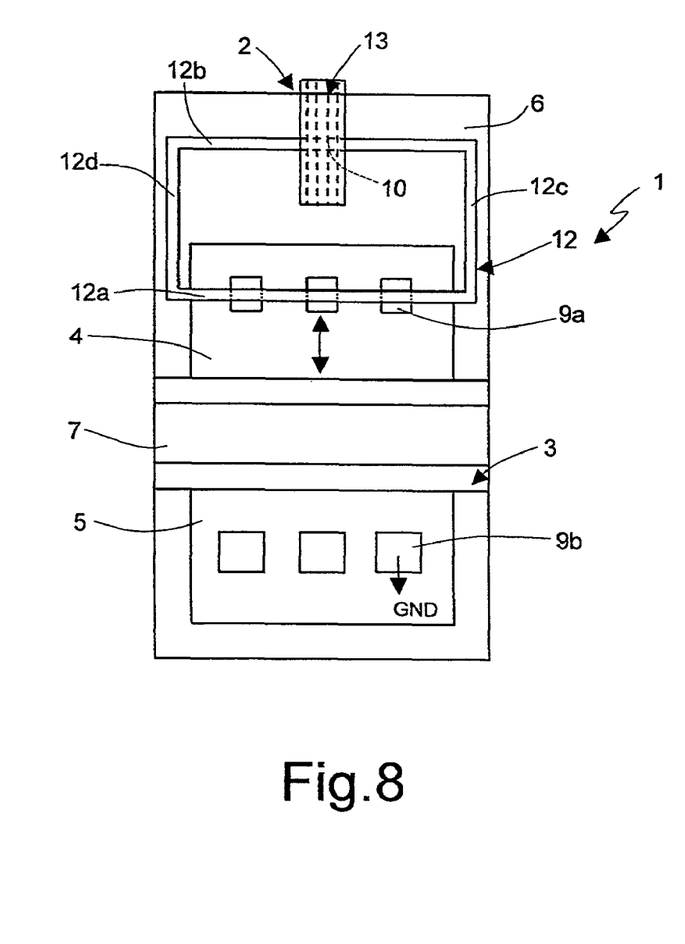
FIG. 8 is a view similar to that of FIG. 7, illustrating a further variant of the fuse device.

According to a further variant (illustrated in FIG. 8), the series resistance in the path of the programming current, and hence the aforesaid ballast effect, can be further increased by removing the silicidation regions 8 on the source and drain regions (thus creating an additional series resistance on both the source and drain contacts), and possibly moving the contact elements 9a of the drain region 4 away from the gate region 7 (as indicated by the arrow in the figure).

In any case, the configuration of the fuse device 1 previously described envisages the passage of the programming current in the fuse element 2 from the top electrode 16 to the bottom one 10. Experimental tests conducted by the applicant have, however, demonstrated an even better repeatability of the programming operations of the fuse element when the direction of the flow of the programming current is reversed. For this purpose, according to further embodiments of the present invention, alternative configurations of the fuse device 1 are proposed, which share the feature of envisaging a flow of the programming current from the bottom electrode 10 to the top electrode 16 of the fuse element 2.

A second embodiment, illustrated in FIGS. 9 and 10, envisages again the use of a selector element 3 of the planar N-channel MOSFET type, but in this case the bottom electrode 10 of the fuse element 2 is connected to the source region 5 of the selector element 3.

In detail, the selector element 3 has an active area 22, having P-type conductivity, made within the substrate 6 (having a P⁻ doping) and isolated by means of isolation trenches 23, for example using the Shallow-Trench Isolation (STI) technique. The drain region 4 and the source region 5 are provided within the active area 22; in detail, the drain region 4 comprises a first drain strip 4a and a second drain strip 4b, which extend in a first direction x parallel to one another, and the source region 5 comprises a source strip extending in the first direction x between the drain strips 4a, 4b. In addition, electrical contacts 24 (illustrated in FIG. 9) contact the drain strips 4a, 4b. The gate region 7 is constituted by a polysilicon rectangular ring structure, which has long portions set between the drain region and the source region, and short portions, which extend in a second direction y, orthogonal to the first direction x, and are set outside the active area 22, where they are contacted by electrical gate contacts. In addition to the fuse element 2, the fuse device 1 comprises two pairs of "dummy" elements 25, arranged laterally to the fuse element 2. Each "dummy" element has the same structure as the fuse element 2, but is not electrically connected and is hence not crossed by current during the programming steps. The presence of the dummy elements 25, however, enables uniform operation of the fuse element 2.

Figure 10:
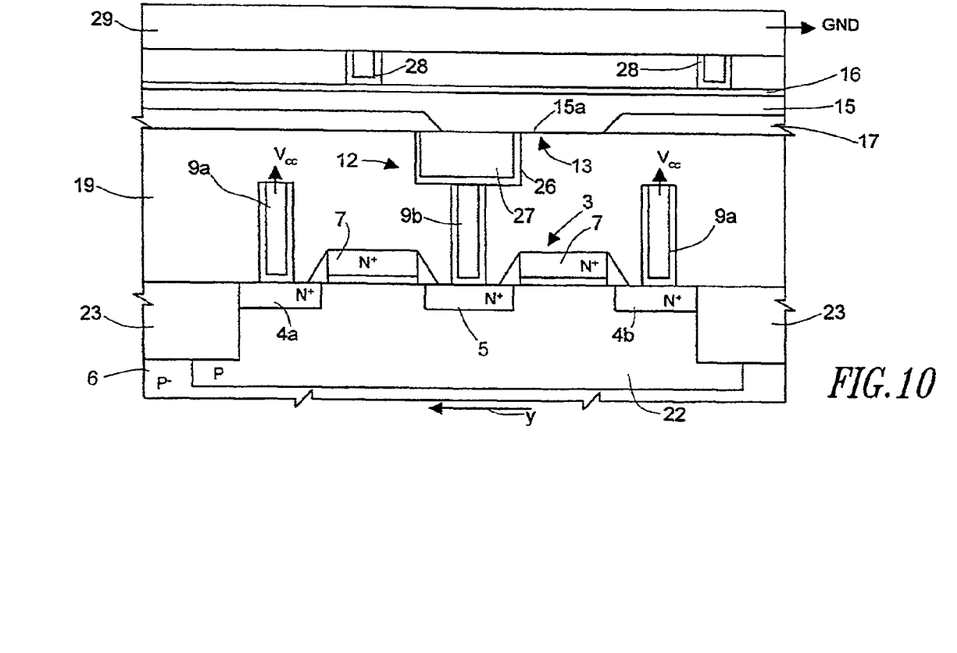
FIG. 10 is a cross-sectional view of the fuse device of FIG. 9, taken along the line X-X.

With reference in particular to FIG. 10, a contact element 9a, associated to the drain region 4, for example a line of tungsten extending in the first direction x, is electrically connected, via the electrical contacts 24, to the high-voltage line $V_{cc}$ (in a way not illustrated), while a contact element 9b, similar to the contact element 9a and associated to the source region 5, is connected to the heater 12 of the fuse element 2 (thus constituting its bottom electrode 10). In particular, the heater 12 has a rectangular shape, contained in the direction y by the long portions of the gate region 7, and is again constituted by a metallic coating 26, for example of TiSiN, forming respective side walls and a respective bottom surface, and by a dielectric filling material 27. The PCM element 13 is set above the heater 12, and has a rectangular shape extending in the second direction y, starting from a central area of the heater 12 towards the second drain strip 4b, overstepping the gate region 7. Contact plugs (so-called "vias 0") 28 electrically connect the top electrode 16 to a first metallization 29 (level-1 metal) that runs in the second direction y over the entire active area 22. The first metallization 29 is also connected to the reference-voltage line GND of the fuse device 1.

In use, the programming current flows from the supply line $V_{cc}$ to the drain region 4, and then to the source region 5. From the source region 5 it flows to the bottom electrode 10, and then through the PCM element 13 (and in particular the storage area 15a) to the top electrode 16, up to the reference-voltage line GND. In particular, the bottom electrode 10 is set at a potential higher than that of the top electrode 16, and, as desired, the current flows from the bottom electrode to the top one.

Said arrangement is therefore advantageous for improving the repeatability of the programming operations, but feels, however, the body effect occurring in the N-channel MOSFET, due to the voltage increase of the source region 5.

Figure 9:
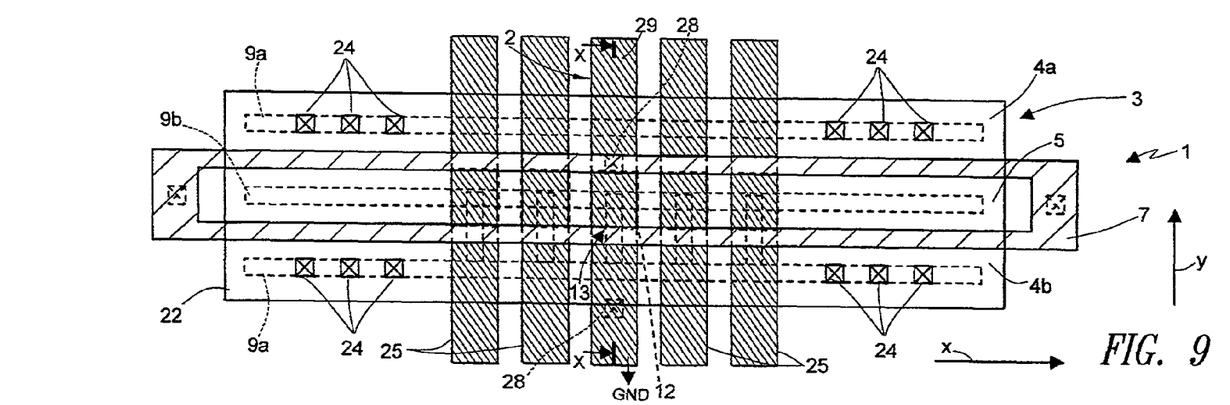
FIG. 9 is a top-plan view of a second embodiment of the fuse device.
Figure 11:
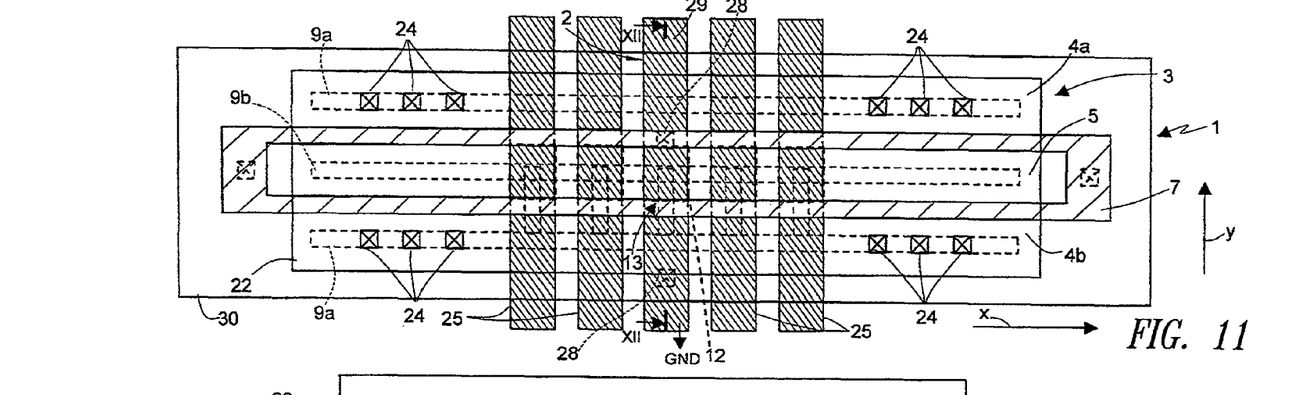
FIG. 11 is a top-plan view of a third embodiment of the fuse device.
Figure 12:
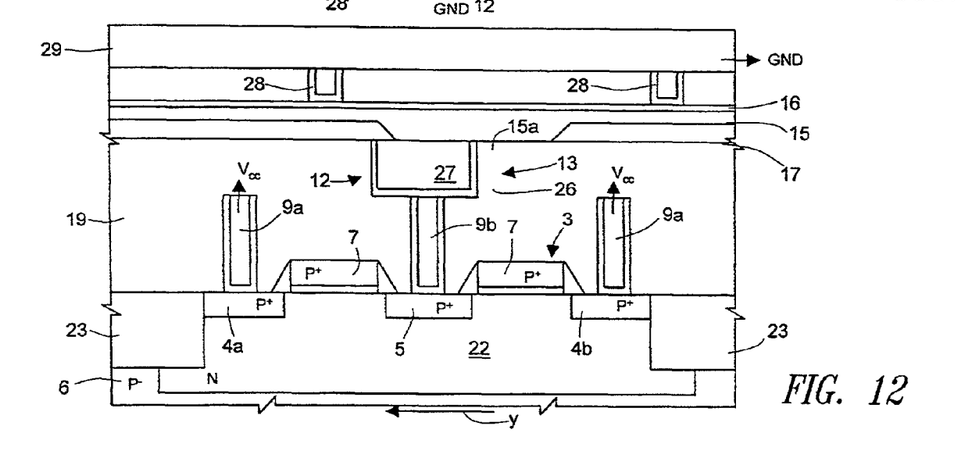
FIG. 12 shows a cross-sectional view of the fuse device of FIG. 11, taken along the line XII-XII.

To solve the above problem, a third embodiment (FIGS. 11-12), envisages a configuration substantially similar to the one described with reference to FIGS. 9-10, with the difference that a P-channel planar MOSFET is used for the selector element 3. In this case, the active area is constituted by a well 30 of N type within a substrate of P⁻ type, and the drain region 4 and source region 5 are also doped with a P-type doping. Said solution has the advantage of not feeling the body effect; however, as is known, the use of P-channel transistors, given the same area occupation, entails the generation of currents of lower value as compared to the use of N-channel transistors.

A fourth embodiment (illustrated in FIGS. 13-14) envisages again the use of a selector element 3 of an N-channel MOSFET type, and at the same time enables elimination of the body effect.

Figures 13, 14, 15:
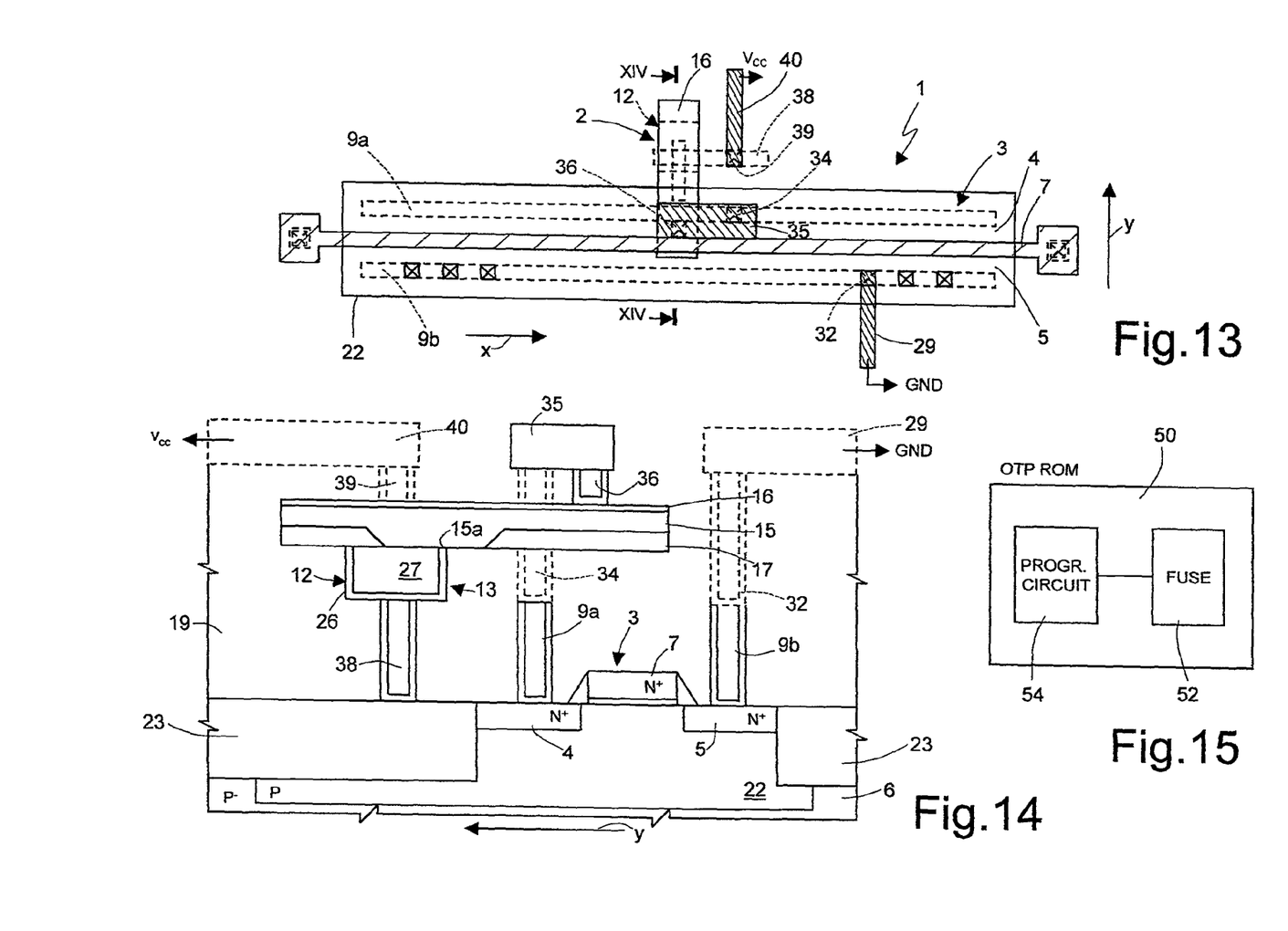
FIG. 13 is a top-plan view of a fourth embodiment of the fuse device.
FIG. 14 shows a cross-sectional view of the fuse device of FIG. 13, taken along the line XIV-XIV.
FIG. 15 shows a simplified block diagram of a one-time-programmable storage device.

In detail, the drain region 4 and the source region 5 are in this case constituted by respective strips extending in the first direction x, and the gate region 7 is also constituted by a strip, which is set between the source and drain regions and carries respective gate contacts at its ends, outside the active area 22.

As illustrated in detail in FIG. 14, a contact element 9b associated to the source region 5 is connected, via a first plug 32, for example made of tungsten surrounded by a Ti/TiN multilayer, to a first metallization 29, connected in turn to the reference-voltage line GND. A contact element 9a associated to the drain region 4 is instead connected, via a second plug 34, to a second metallization 35 (constituting an internal node). The second metallization 35 extends in the first direction x, until it reaches the top electrode 16 of the fuse element 2, to which it is connected via a third plug 36 (so-called "via 0"). The bottom electrode of the fuse element 2 is instead connected to a connection line 38, for example made of tungsten, provided above the substrate 6, in a position corresponding to an isolation trench 23. A fourth plug 39 connects the connection line 38 (which also extends in the first direction x) to a third metallization 40, connected to the high-voltage line $V_{cc}$.

In use, the programming current flows from the supply line $V_{cc}$ to the connection line 38 (the bottom electrode of the fuse element), then through the PCM element 13 (and in particular the storage area 15a) and the top electrode 16; from this it flows through the second metallization 35 to the drain region 4, then to the source region 5, and finally to the reference-voltage line GND. In particular, also in this case, the current flows advantageously from the bottom electrode 10 to the top electrode 16.

According to said configuration, the fuse element 2 is not vertically aligned to one of the current-conduction regions of the selector element 3, as in the preceding solutions, but is shifted laterally (in the second direction y). Said configuration consequently entails a greater area occupation as compared to the preceding solutions. At the same time, it does not feel the body effect, in so far as the source region 5 is connected to the reference-voltage line GND.

As illustrated in FIG. 15, the fuse device 1 can advantageously be used as a memory element of a one-time-programmable ROM storage device 50. In particular, the ROM storage device 50 comprises a bank of programmable fuses 52 comprising a plurality of fuse devices (each made as described previously), and a purposely provided programming circuit 54, coupled to the bank of programmable fuses 52 to carry out programming thereof.

The advantages of the fuse device and of the corresponding programming method are clear from the foregoing description.

In any case, it is emphasized that the fuse device has reduced costs and area occupation, and small programming times (less than 10 μs, if both "0" and "1" data are programmed; less than 100 ns if only the "0" datum is programmed, as described hereinafter). Furthermore, it does not require either additional process steps with respect to the classic steps of the semiconductor industry (as, instead, is required for example by the laser-programmed fuses), or thick oxide layers (as, instead, is required by the E²PROMs). The described structures also have a vertical structure, and a small overall encumbrance.

The electrical alteration of the fuse device is highly repeatable, thanks to the fact that the area of contact between the PCM element and the heater has small (i.e., sublithographic) dimensions, which are controllable with extreme precision. Said repeatability is further increased in the arrangements envisaging a flow of current in the fuse element 2 from the bottom electrode 10 to the top electrode 16.

Amongst the various embodiments described, particularly advantageous is the one that envisages the use of a P-channel selector transistor.

Furthermore, tests conducted by the applicant have demonstrated the capability of the fuse device to maintain the programmed data, even after baking at 250° C. for 24 hours.

In addition, it is reasonable to expect that the breaking currents and voltages will follow the same scaling law as PCM memory cells (described, for example, in "Scaling Analysis of Phase-Change Memory Technology", Pirovano et al., IEDM Tech. Dig., pp. 699-702, 2003). In particular, the breaking voltage will remain practically constant, whilst the programming current will decrease linearly as the scale of integration used in the manufacturing process decreases. Advantageously, this will enable fuse devices (inclusive of the fuse element and the corresponding selector element) to be made that are increasingly compact with scaling-down of the technology used.

Finally, it is clear that modifications and variations can be made to what is described and illustrated herein, without thereby departing from the scope of the present invention, as defined in the annexed claims.

In particular, the programming of the closed state (corresponding to the "1" value) is not strictly necessary in so far as, as is known, storage elements made of virgin chalcogenic material are already crystalline (low-resistivity state), and remain crystalline even after operations such as on-board packaging and soldering (consequently, the information associated to the crystalline state is stable). However, it may be advantageous to program, as described previously, also the closed state, to obtain higher values of conductivity (and so facilitate the operations of reading, for example using sense amplifiers).

Finally, it is emphasized that programming of the fuse element 2 can be achieved via selector elements different from the ones illustrated (for example using BJTs).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A fuse device, comprising:
   a fuse element including:
      a first terminal;
      a second terminal;
      a phase-change region, including an electrically breakable region of phase-change material configured to undergo permanent physical breaking as a result of the supply of a programming electrical quantity; and a heating element of conductive material in contact with said first terminal, said electrically breakable region being arranged at a contact area at which said heating element contacts said phase-change region, wherein the permanent physical breaking renders the fuse element permanently non-conductive, wherein said heating element has a rectangular ring shape having a first side portion extending longitudinally in a first direction, a second side portion extending longitudinally in a second direction that is substantially parallel to the first direction, a third side portion extending longitudinally in a third direction from the first side portion to the second side portion, and a fourth side portion extending longitudinally in a fourth direction from the first side portion to the second side portion, the third and fourth directions being substantially perpendicular to the first and second directions, the first side portion having a surface in contact at the contact area with the phase-change region and being positioned in a fifth direction with respect to the contact area, and the first and second side portions being spaced apart from one another in the third and fourth directions, the fifth direction being substantially perpendicular to the first direction;

a selector element electrically connected to said fuse element and configured to enable the supply of said programming electrical quantity to said fuse element, wherein the selector element includes a first conduction terminal and a second conduction terminal; and a conductive contact element contacting the second side portion of the heating element and the first conduction terminal of the selector element, the conductive contact element being entirely spaced apart in a sixth direction with respect to the first side portion of the heating element, the sixth direction being substantially parallel to the third and fourth directions.

2. The fuse device according to claim 1, wherein said selector element is configured to enable supply to said electrically breakable region of a programming pulse with a current comprised between 2 mA and 3 mA, a voltage comprised between 2 V and 3 V, and a duration comprised between 100 ns and 1 µs.

3. The fuse device according to claim 1, wherein said selector element is a transistor element, the first conduction terminal is a current output terminal, and the second conduction terminal is a current input terminal.

4. The fuse device according to claim 1, wherein said first side portion and said second side portion are spaced apart from each other by a dielectric filling material.

5. The fuse device according to claim 1, wherein said fuse element has a vertical structure, and said electrically breakable region has a cross section with sub lithographic dimensions.

6. The fuse device according to claim 1, wherein, in at least one operating condition, said second terminal has a voltage higher than a voltage of said first terminal, and said programming electrical quantity comprises a programming current flowing from said second terminal to said first terminal.

7. The fuse device according to claim 1, wherein the contact area is laterally spaced apart from the selector element.

8. The fuse device according to claim 1, wherein the first, second, third, and fourth directions are horizontal directions, the fifth direction is a vertical direction, a surface of the first side portion of the heating element is a top surface that contacts a bottom surface of the phase-change region at the contact area, and the conductive contact element extends vertically between a bottom surface of the second side portion of the heater element and the first conduction terminal of the selector element.

9. A one-time-programmable storage device, comprising a plurality of fuse devices, each fuse device including:

a fuse element having a first terminal; a second terminal; a phase-change region, including an electrically breakable region of phase-change material configured to undergo breaking as a result of the supply of a programming electrical quantity; and a heating element of conductive material in contact with said first terminal, said electrically breakable region being arranged at a contact area at which said heating element contacts said phase-change region, wherein said heating element has a first side and a second side, the first side being in contact at the contact area with the phase-change region and being positioned vertically with respect to the contact area, and the first and second sides being horizontally spaced apart from one another;

a selector element electrically connected to said fuse element and configured to enable the supply of said programming electrical quantity to said fuse element, the selector element including a first conduction terminal and a second conduction terminal; and a conductive first contact element extending vertically between a bottom surface of the second side of the heater element and the second conduction terminal of the selector element and being entirely spaced apart horizontally with respect to the first side of the heater element.

10. The storage device according to claim 9, further comprising a programming circuit configured to supply to at least one of said fuse devices said programming electrical quantity.

11. The storage device according to claim 9, wherein said selector element is configured to enable supply to said electrically breakable region of a programming pulse with a current comprised between 2 mA and 3 mA, a voltage comprised between 2 V and 3 V, and a duration comprised between 100 ns and 1 µs.

12. The storage device according to claim 9, wherein said selector element is a transistor element having a current input terminal and a current output terminal, and wherein said heating element has a rectangular ring shape.

13. The storage device according to claim 9, wherein:
said selector element is a transistor element;
the second conduction terminal a current output terminal;
the first conduction terminal is a current input terminal; and
said selector element is formed in a substrate of semiconductor material.

14. The storage device according to claim 9, wherein said fuse element has a vertical structure, and said electrically breakable region has a cross section with sublithographic dimensions.

15. The storage device according to claim 9, wherein the contact area is laterally spaced apart from the entire selector element.

16. A process for manufacturing a fuse device, comprising:
forming a fuse element using steps including:
forming a first terminal and a second terminal; and
forming an electrically breakable region between said first terminal and said second terminal, wherein forming the electrically breakable region comprises forming a region of phase-change material configured to undergo permanent physical breaking as a result of the supply of a programming electrical quantity; and
forming a heating element of conductive material in contact with said first terminal, said electrically breakable region being arranged at a contact area at which said heating element contacts said electrically breakable region, wherein said heating element has a rectangular ring shape having a first side portion extending longitudinally in a first direction, a second side portion extending longitudinally in a second direction that is substantially parallel to the first direction, a third side portion extending longitudinally in a third direction from the first side portion to the second side portion, and a fourth side portion extending longitudinally in a fourth direction from the first side portion to the second side portion, the third and fourth directions being substantially perpendicular to the first and second directions, the first side portion having a surface in contact at the contact area with the phase-change region and being positioned in a fifth direction with respect to the contact area, and the first and second side portions being spaced apart from one another in the third and fourth directions, the fifth direction being substantially perpendicular to the first direction;

forming a selector element electrically connected to said fuse element and configured to enable the supply of said programming electrical quantity to said fuse element, wherein the selector element includes a first conduction terminal and a second conduction terminal; and forming an electrical connection element contacting the second side portion of the heating element and the second conduction terminal of the selector element, the electrical connection element being entirely spaced apart in a sixth direction with respect to the first side portion of the heating element, the sixth direction being substantially parallel to the third and fourth directions.

17. The process according to claim 16, wherein said contact area is at a bottom side of the phase-change region and the second terminal contacts a top side of the phase-change region, the process further comprising forming the electrical connection element extending between the second conduction terminal of the selector element and a bottom surface of the second side portion of the heating element.

18. The process according to claim 16, wherein the contact area is laterally spaced apart from the entire selector element.

19. The storage device according to claim 9, wherein
said heating element has a rectangular ring shape including the first side which extends longitudinally in a first horizontal direction, the second side which extends longitudinally in a second horizontal direction that is substantially parallel to the first horizontal direction, a third side extending longitudinally in a third horizontal direction from the first side to the second side, and a fourth side extending longitudinally in a fourth horizontal direction from the first side to the second side, the third and fourth horizontal directions being substantially perpendicular to the first and second horizontal directions, and the first and second sides being spaced apart from one another in the third and fourth horizontal directions; and
the conductive first contact element is entirely spaced apart in a fifth horizontal direction with respect to the first side of the heating element, the fifth horizontal direction being substantially parallel to the third and fourth horizontal directions.

* * * * *